(12) United States Patent
Jeong et al.

(10) Patent No.: US 10,670,930 B2
(45) Date of Patent: Jun. 2, 2020

(54) LIQUID CRYSTAL DISPLAY CAPABLE OF PREVENTING DISPLAY DEFECT AND RUBBING FAILURE

(71) Applicant: LG Display Co., Ltd., Seoul (KR)

(72) Inventors: Seonghun Jeong, Paju-si (KR); Hyuck Choi, Paju-si (KR); Haye Kim, Goyang-si (KR); Minkyu Chun, Jeonju-si (KR); Kangil Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 228 days.

(21) Appl. No.: 15/822,180

(22) Filed: Nov. 26, 2017

(65) Prior Publication Data

US 2018/0188616 A1    Jul. 5, 2018

(30) Foreign Application Priority Data

Nov. 29, 2016    (KR) ......................... 10-2016-0160260

(51) Int. Cl.
  *G02F 1/1343*    (2006.01)
  *G02F 1/1362*    (2006.01)
  (Continued)

(52) U.S. Cl.
  CPC ........ *G02F 1/134336* (2013.01); *G02F 1/136* (2013.01); *G02F 1/13306* (2013.01); *G02F 1/136286* (2013.01); *G09G 3/3648* (2013.01); *H01L 27/124* (2013.01); *G02F 2001/13606* (2013.01); *G02F 2001/133388* (2013.01);
  (Continued)

(58) Field of Classification Search
  CPC .......... G02F 1/134336; G02F 1/13306; G02F 1/136286; G02F 2201/123; G02F 1/136; G02F 2201/40; G02F 2001/133388; G02F 1/134309; H01L 27/124; G09G 3/3648; G09G 2300/0413
  See application file for complete search history.

(56) References Cited

U.S. PATENT DOCUMENTS

2004/0032557 A1*  2/2004  Lee .................... G02F 1/134363
                                                                349/141
2013/0148050 A1*  6/2013  Kwon ............... G02F 1/136204
                                                                 349/43
(Continued)

FOREIGN PATENT DOCUMENTS

KR    10-2009-0089630 A    8/2009

*Primary Examiner* — Huyen L Ngo
(74) *Attorney, Agent, or Firm* — Polsinelli PC

(57) ABSTRACT

A liquid crystal display preventing a light leakage is disclosed. The liquid crystal display includes gate lines and data lines disposed to cross over each other, a common line crossing over the data lines and disposed in parallel with the gate lines, a dummy data line crossing over the gate lines and disposed in parallel with the data lines, a dummy pixel electrode disposed in a dummy area formed by an outermost data line of the data lines, the dummy data line and first and second gate lines adjacent to each other among the gate lines; a pixel electrode disposed in a pixel area between first and second data lines adjacent to each other among the data lines and the first and second gate lines; and a common electrode disposed to overlap the pixel electrode and the dummy pixel electrode. The dummy pixel electrode is connected to the common line.

18 Claims, 6 Drawing Sheets

(51) Int. Cl.
*G02F 1/136* (2006.01)
*G02F 1/133* (2006.01)
*G09G 3/36* (2006.01)
*H01L 27/12* (2006.01)
*G02F 1/1333* (2006.01)

(52) U.S. Cl.
CPC .. *G02F 2201/121* (2013.01); *G02F 2201/123* (2013.01); *G02F 2201/40* (2013.01); *G09G 2300/0413* (2013.01)

(56) References Cited

U.S. PATENT DOCUMENTS

| | | | |
|---|---|---|---|
| 2016/0005364 A1* | 1/2016 | Kobayashi | G09G 3/3648 345/206 |
| 2016/0062203 A1* | 3/2016 | Ono | G02F 1/134363 349/43 |
| 2017/0116936 A1* | 4/2017 | Nishida | G02F 1/133345 |
| 2017/0205668 A1* | 7/2017 | Kim | G02F 1/133788 |

* cited by examiner

LIQUID CRYSTAL DISPLAY CAPABLE OF PREVENTING DISPLAY DEFECT AND RUBBING FAILURE

CROSS-REFERENCE TO RELATED APPLICATION

This disclosure claims the benefit of priority under 35 U.S.C. § 119(a) to Republic of Korea Patent Application No. 10-2016-0160260 filed on Nov. 29, 2016, the entire contents of which is incorporated herein by reference for all purposes as if fully set forth herein.

BACKGROUND

Field of the Disclosure

The disclosure relates to a display device, and more particularly, to a liquid crystal display that can prevent a display defect as well as a rubbing failure.

Description of the Background

The importance of flat panel displays (FPDs) is recently increasing with the growth of multimedia. Thus, various types of flat panel displays such as liquid crystal displays (LCDs), plasma display panels (PDPs), field emission displays (FEDs), and organic light emitting diode (OLED) displays are put into practical use.

Among the various types of flat panel displays, the liquid crystal display is driven using optical anisotropy and polarization properties of liquid crystals. The liquid crystals have an orientation of liquid crystal molecules because of a thin and long structure of the liquid crystals and can control the orientation of the liquid crystal molecules by applying an electric field to the liquid crystals. Thus, when the orientation of the liquid crystal molecules can be controlled, the arrangement of the liquid crystal molecules can be changed. Light is refracted according to the orientation of the liquid crystal molecules due to the optical anisotropy of the liquid crystals, thereby representing image information.

An active matrix liquid crystal display (AMLCD) (hereinafter abbreviated to "liquid crystal display"), in which thin film transistors and pixel electrodes connected to the thin film transistors are arranged in a matrix form, is currently attracting the most attention because of its excellent resolution and video implementation capability. The liquid crystal display displays a motion picture using the thin film transistor as a switching element. The liquid crystal display includes an upper transparent substrate, a lower transparent substrate, and a liquid crystal layer having an anisotropic dielectric constant between the upper transparent substrate and the lower transparent substrate. The liquid crystal display controls an intensity of an electric field formed in the liquid crystal layer in accordance with video data and changes an arrangement of molecules of a liquid crystal material, thereby displaying a desired image.

A driving circuit of the liquid crystal display includes a data driving circuit supplying data voltages of video data to data lines of a display panel and a gate driving circuit sequentially supplying gate pulses synchronized with the data voltages to gate lines (or referred to as "scan lines") of the display panel.

Hereinafter, a related art liquid crystal display is described with reference to FIGS. 1 to 3. FIG. 1 is a block diagram schematically illustrating the related art liquid crystal display. FIG. 2 is a plan view schematically illustrating a region R1 shown in FIG. 1. FIG. 3 is a cross-sectional view taken along line I-I' of FIG. 2.

Referring to FIGS. 1 to 3, the related art liquid crystal display includes a display panel 10, a timing controller 20, a data driving circuit 30, a gate driving circuit 40, and the like.

The display panel 10 includes a pixel array displaying an input image. The pixel array may be divided into a thin film transistor array TFTA formed at a lower substrate SUB1 (or referred to as "first substrate"), a color filter array CFA formed at an upper substrate SUB2 (or referred to as "second substrate"), and liquid crystal cells Clc. The thin film transistor array TFTA includes data lines 11, gate lines (or referred to as "scan lines") 12 crossing over the data lines 11, thin film transistors TFT respectively formed at crossings of the data lines 11 and the gate lines 12, pixel electrodes 1 connected to the thin film transistors TFT, storage capacitors Cst, and the like. The thin film transistor array TFTA further includes dummy pixel electrodes 1a disposed adjacent to left and right outermost pixel electrodes 1. The color filter array CFA formed at the upper substrate SUB2 of the display panel 10 includes black matrix BM and color filters CF. A common electrode 2 may be formed on the lower substrate SUB1 or the upper substrate SUB2. The liquid crystal cells Clc are driven by an electric field between the pixel electrode 1 supplied with a data voltage and the common electrode 2 supplied with a common voltage Vcom.

The timing controller 20 generates timing control signals for controlling operation timings of the data driving circuit 30 and the gate driving circuit 40 using timing signals from a host controller. The timing control signals for controlling the operation timings of the data driving circuit 30 and the gate driving circuit 40 include a data timing control signal for controlling the operation timing of the data driving circuit 30 and a polarity of the data voltage and a gate timing control signal for controlling the operation timing of the gate driving circuit 40.

The data driving circuit 30 receives digital video data RGB from the timing controller 20. The data driving circuit 30 converts the digital video data RGB into positive and negative analog data voltages in response to a source timing control signal from the timing controller 20 and then supplies the data voltages to the data lines 11 of the display panel 10 so that the data voltages are synchronized with gate pulses (or referred to as "scan pulses").

The gate driving circuit 40 sequentially outputs the gate pulses under the control of the timing controller 20 and shifts a swing voltage of an output of the gate pulses to a gate high voltage VGH and a gate low voltage VGL. The gate pulses output from the gate driving circuit 40 are synchronized with the data voltages output from the data driving circuit 30, and are sequentially supplied to the gate lines 12. The gate high voltage VGH is a voltage equal to or greater than a threshold voltage of the thin film transistor, and the gate low voltage VGL is a voltage less than the threshold voltage of the thin film transistor.

In the general liquid crystal display, a parasitic capacitance applied to the data lines 11 can affect a data signal, causing change in a pixel voltage during a display drive operation. However, because the pixel electrode is disposed on only one side of the data line (hereinafter, referred to as "outermost data line") positioned at an outermost side of a display area DA unlike the data lines positioned inside the display area DA, there is a difference between a parasitic capacitance applied to the outermost data line and a parasitic capacitance applied to the data lines inside the display area DA. The difference in the parasitic capacitance changes a driving voltage of the pixel electrodes connected to the outermost data line, thereby generating a defect in a vertical line.

In order to prevent such a defect, dummy areas DUA having dummy pixel electrodes 1a similar to the pixel electrodes 1 disposed in the display area DA are respectively disposed in non-display areas NDA at left and right ends of the display area DA.

Referring to FIGS. 2 and 3, the related art liquid crystal display includes the thin film transistor array TFTA and the color filter array CFA that are positioned opposite each other with a liquid crystal layer LC interposed therebetween.

A common line CL and a gate line 12b are disposed on the first substrate SUB1 of the thin film transistor array TFTA to be in parallel with each other. A gate insulating layer GI is stacked on the first substrate SUB1 to cover the common line CL and the gate line 12b.

A dummy data line 11a and the data line 11 are disposed on the gate insulating layer GI to be in parallel with each other. A gate link line 12a extended from the gate driving circuit 40 is disposed on the gate insulating layer GI. In the dummy area DUA, a dummy source electrode and a dummy drain electrode of a dummy thin film transistor DTFT are disposed on the gate insulating layer GI. In a pixel area PA, a source electrode and a drain electrode of the thin film transistor TFT are disposed on the gate insulating layer GI.

A first passivation layer PAS1 is stacked on the gate insulating layer GI to cover the gate link line 12a, the dummy data line 11a, the data line 11, the dummy thin film transistor DTFT, and the thin film transistor TFT.

In the display area DA, the common electrode 2 is disposed on the first passivation layer PAS1. In the non-display area NDA, a gate connection pattern 12c is disposed on the first passivation layer PAS1 to overlap the gate link line 12a and the gate line 12b.

The gate connection pattern 12c is connected to the gate link line 12a exposed through a contact hole penetrating the first passivation layer PAS1, and the gate line 12b exposed through a contact hole penetrating the first passivation layer PAS1 and the gate insulating layer GI. Hence, the gate link line 12a and the gate line 12b are connected to each other by the gate connection pattern 12c.

A second passivation layer PAS2 is stacked on the first passivation layer PAS1 to cover the common electrode 2 and the gate connection pattern 12c.

In the dummy area DUA, the dummy pixel electrodes 1a are disposed on the second passivation layer PAS2 to overlap the common electrode 2. In the pixel area PA, the pixel electrodes 1 are disposed on the second passivation layer PAS2 to overlap the common electrode 2.

Because the dummy area DUA belongs to the non-display area NDA on which an image is not displayed, the dummy pixel electrode 1a is not connected to the dummy thin film transistor DTFT. On the other hand, because the pixel electrode 1 belongs to the display area DA on which an image is displayed, the pixel electrode 1 is connected to the thin film transistor TFT. The pixel electrode 1 is connected to the drain electrode of the thin film transistor TFT exposed through a drain contact hole DH penetrating the second passivation layer PAS2 and the first passivation layer PAS1.

On the second substrate SUB2 of the color filter array CFA, the color filters CF and the black matrix BM are disposed. The color filters CF are disposed corresponding to a dummy pixel electrode DPx of the dummy area DUA and a pixel electrode Px of the pixel area PA. The black matrix BM is disposed to be overlapped with the dummy thin film transistor DTFT of the dummy area DUA and the thin film transistor TFT of the pixel area PA. The black matrix BM partition the color filters CF.

In the related art liquid crystal display having the above-described configuration, the thin film transistor TFT, the pixel electrode Px, and the drain contact hole DH are disposed in the pixel area PA positioned at an outermost side of the display area DA, and the pixel electrode Px is connected to the drain electrode DE of the thin film transistor TFT through the drain contact hole DH. On the other hand, there are the dummy thin film transistor DTFT and the dummy pixel electrode DPx in the dummy area DUA of the non-display area NDA, and the dummy pixel electrode DPx is not connected to the dummy thin film transistor DTFT. Because the dummy pixel electrode DPx is maintained in a floating state as described above, the data voltage is not supplied to the dummy pixel electrode DPx. Hence, power consumption can be reduced. However, because the common voltage Vcom is supplied to the common electrode 2, a potential difference may occur between the common electrode 2 and the dummy pixel electrode 1a.

Accordingly, there is still a difference between a parasitic capacitance applied to the data line positioned at the outermost side of the display area DA and a parasitic capacitance applied to the data line positioned inside the display area DA. As a result, a display defect is generated in the pixel area disposed on the outermost data line.

SUMMARY

Accordingly, the present disclosure is to address the above-described and other problems, and the disclosure provides a liquid crystal display capable of preventing a display defect and a light leakage phenomenon that may occur in a pixel area disposed on an outermost line in an ultra-high resolution display device.

In one aspect of the disclosure, there is provided a liquid crystal display including gate lines and data lines crossing over each other, a common line crossing over the data lines and disposed in parallel with the gate lines, a dummy data line crossing over the gate lines and disposed in parallel with the data lines, a dummy pixel electrode disposed in a dummy area formed by an outermost data line of the data lines, the dummy data line, and the gate lines, a pixel electrode disposed in a pixel area between inside data lines of the data lines and the gate lines, and a common electrode overlapping the pixel electrode and the dummy pixel electrode, wherein the dummy pixel electrode is electrically connected to the common line.

The dummy pixel electrode is connected to a protrusion extended from the common line and disposed between the gate line and the common line adjacent to each other.

The common line is connected to the common electrode in the dummy area and the pixel area.

The liquid crystal display according to the disclosure further includes a dummy thin film transistor disposed in the dummy area, including a dummy gate electrode extended from the gate line, a dummy source electrode overlapping the dummy gate electrode and is extended from the dummy data line, and a dummy drain electrode overlapping the dummy gate electrode and is spaced apart from the dummy source electrode by a predetermined distance; and a thin film transistor line disposed in the pixel area, including a gate electrode extended from the gate, a source electrode overlapping the gate electrode and is extended from the data line, and a drain electrode overlapping the gate electrode, is spaced apart from the source electrode by a predetermined distance, and is connected to the pixel electrode.

The dummy pixel electrode is connected to the common line between the dummy gate electrode and the gate electrode.

The gate lines and the common line are disposed on a substrate. The data line, the dummy source electrode, the dummy drain electrode, the source electrode, and the drain electrode are disposed on a gate insulating layer covering the gate line and the common line. The common electrode is disposed on a first passivation layer covering the data line. The dummy pixel electrode and the pixel electrode are disposed on a second passivation layer covering the common electrode.

The dummy pixel electrode is connected to the common line exposed through a dummy pixel contact hole penetrating the second passivation layer, a first passivation layer, and the gate insulating layer.

The liquid crystal display according to the disclosure further includes a gate link line disposed between a gate driving circuit supplying a gate driving signal to the gate lines and the gate line; and a connection pattern connecting the gate link line to the gate line.

In another aspect of the disclosure, there is provided a liquid crystal display comprising: a gate line and a common line disposed on a substrate and parallel with each other; a gate insulation layer on the substrate and covering the first gate line and the common line; a data line on the gate insulation layer and crossing over the gate line; a dummy data line on the gate insulation layer, crossing over the gate line, and disposed in parallel with the data line; a first passivation layer on the gate insulation layer and covering the data line and a dummy data line; a common electrode on the first passivation layer; a second passivation layer on the first passivation layer and covering the common electrode; a dummy pixel electrode in a dummy area of the second passivation layer; and a pixel electrode disposed in a pixel area of the second passivation layer, and disposed in parallel with the dummy pixel electrode, wherein the common electrode overlaps the pixel electrode and the dummy pixel electrode, wherein the dummy pixel electrode is electrically connected to the common line through a dummy pixel contact hole.

The pixel electrode is connected to a drain electrode through a drain contact hole in the first and the second passivation layer.

The dummy pixel contact hole passes through the second passivation layer, the first passivation layer and the gate insulation layer.

The dummy pixel electrode is connected to a protrusion extended from the common line and disposed between the first gate line and the common line adjacent to each other.

The common line is connected to the common electrode in the dummy area and the pixel area.

The liquid crystal display according to the disclosure further includes a dummy thin film transistor disposed in the dummy area, including a dummy gate electrode extended from the gate line, a dummy source electrode extended from the dummy data line, and a dummy drain electrode spaced apart from the dummy source electrode by a predetermined distance; and a thin film transistor line disposed in the pixel area, including a gate electrode extended from the gate, a source electrode extended from the data line, and a drain electrode spaced apart from the source electrode by a predetermined distance, and connected to the pixel electrode.

The liquid crystal display according to the disclosure further includes a gate link line on the gate insulation and extended from a gate driving circuit supplying a gate driving signal, and connected to the gate line.

The liquid crystal display according to the disclosure further includes a connection pattern connecting the gate link line to the gate line.

According to the aspects of the disclosure, because the dummy pixel electrode disposed in the dummy area is connected to the common electrode, the parasitic capacitance caused by the common electrode and the pixel electrode can be removed. Hence, the disclosure can prevent the display defect.

Furthermore, because the dummy pixel electrode disposed in the dummy area is between the gate line and the common line and is connected to the common electrode, the dummy pixel contact hole can be disposed on the same plane as the drain contact hole without changing the position of the dummy pixel contact hole for connecting the dummy pixel electrode to the common electrode. Hence, the disclosure can prevent a rubbing failure.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
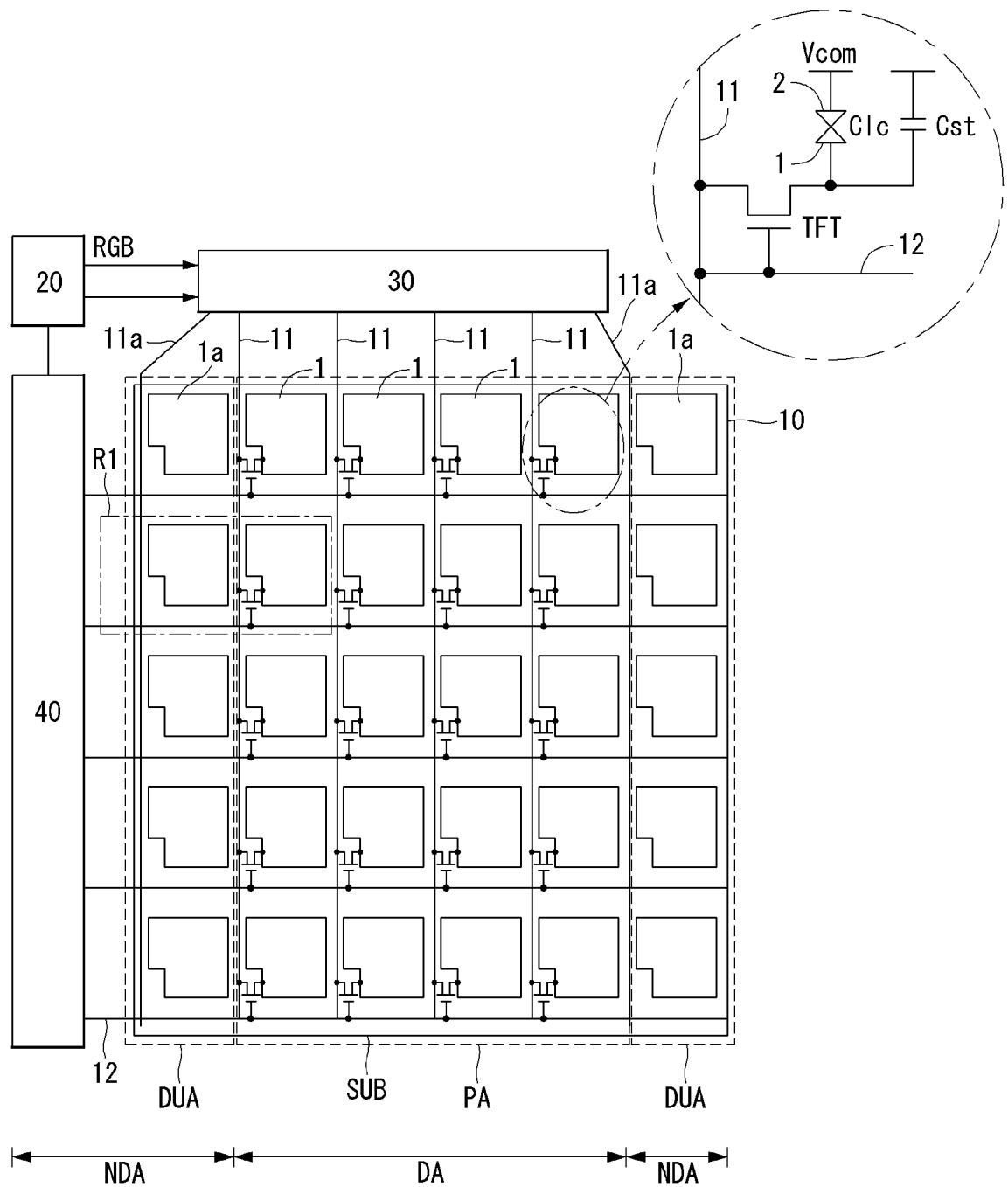
FIG. 1 is a block diagram schematically illustrating the related art liquid crystal display.
Figure 2:
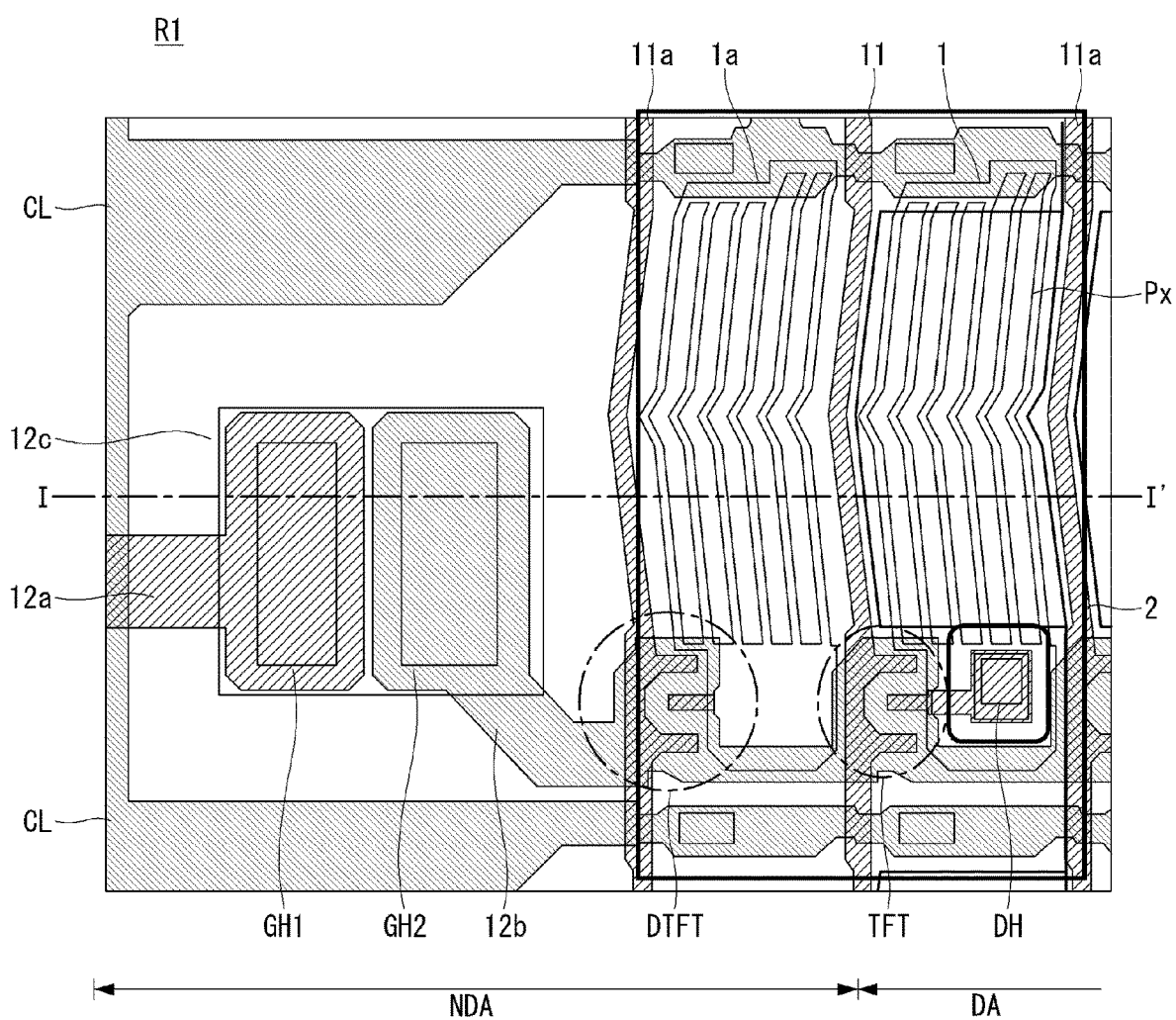
FIG. 2 is a plan view schematically illustrating a region R1 shown in FIG. 1.
Figure 3:
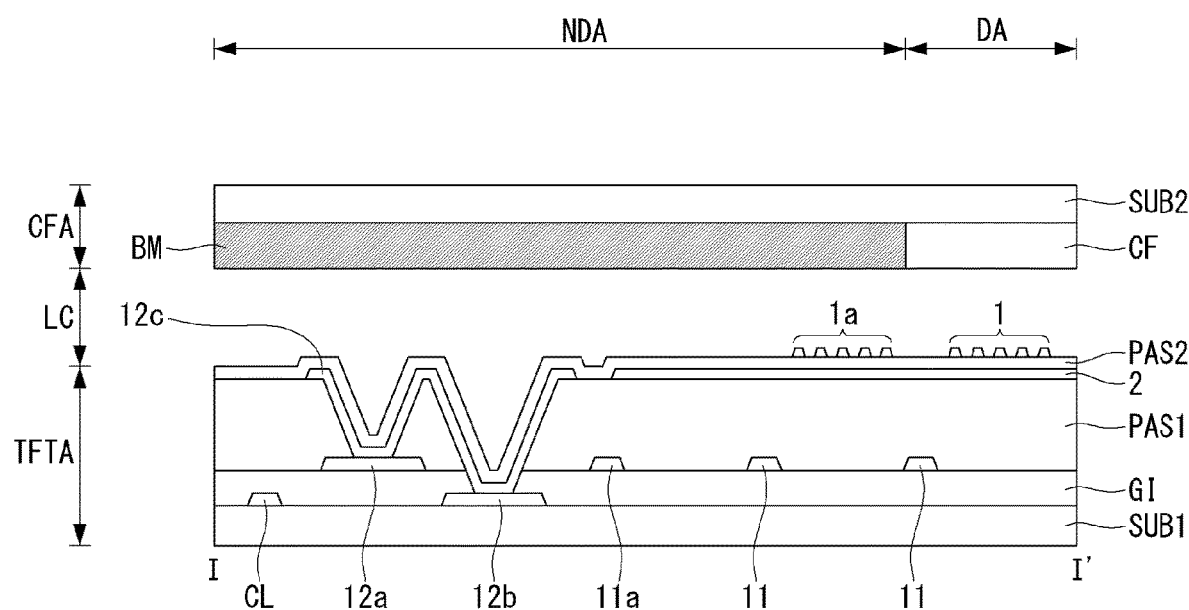
FIG. 3 is a cross-sectional view taken along line I-I' of FIG. 2.

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the aspects of the disclosure. Names of the respective elements used in the following explanations are selected only for convenience of writing the specification and may be thus different from those used in actual products.

In order to prevent a display defect resulting from a light leakage of a pixel area disposed on an outermost row of a display area, the inventors have developed a liquid crystal display according to the disclosure by paying attention to connecting a common electrode to a dummy pixel electrode and making them equipotential voltage, thereby removing a parasitic capacitance.

In order to secure an aperture ratio in a general liquid crystal display, a gate line and a common line are positioned at the center of a black matrix, and a drain contact hole formed in the pixel area is positioned at an end of the black matrix.

When the common electrode and the dummy pixel electrode are connected to remove the parasitic capacitance, a contact hole used to connect the common electrode to the dummy pixel electrode is present between the gate line and the dummy pixel electrode because of a position of the dummy pixel electrode. In this instance, the dummy pixel electrode, the contact hole, the gate line, and the common line are disposed in the order named in the dummy area, and the pixel electrode, the contact hole, the gate line, and the common line are disposed in the order named in the display area. A black matrix for the prevention of a light leakage is disposed corresponding to the area having the connection construction to cover a light leakage prevention area. However, considering a margin of the black matrix covering the light leakage prevention area, the black matrix may further cover a region occupied by the dummy pixel electrode and the pixel electrode, thereby reducing the aperture ratio.

In order to prevent a reduction of the aperture ratio, it may be considered that a dummy contact hole for connecting the dummy pixel electrode to the common electrode is again formed at a position of the contact hole for connecting the common electrode to the common line. However, in this instance, a possibility of a rubbing failure resulting from change in a position of the drain contact hole and the dummy contact hole may increase.

Accordingly, the inventors have developed a liquid crystal display capable of solving the problems of the display defect, a reduction of the aperture ratio, and the rubbing failure in consideration of such expected problems.

In aspects of the disclosure, the term "dummy area" is an area adjacent to an outermost side of a display area and indicates a portion of a non-display area in which a dummy pixel electrode and a dummy thin film transistor similar to a pixel electrode and a thin film transistor disposed in the display area are disposed.

The term "dummy pixel electrode" is a pixel electrode disposed in the dummy area and is not supplied with a data voltage but is supplied with a common voltage. The dummy pixel electrode is used to reduce a difference between a parasitic capacitance generated by a data line (or referred to as "outermost data line") disposed on an outermost row of the display area in which the pixel electrode is disposed on only one side of the outermost data line and a parasitic capacitance generated by a data line (or referred to as "inside data line") disposed inside the display area.

The term "dummy thin film transistor" is a thin film transistor configured so that a dummy pixel area of the dummy area has a structure similar to a pixel area of the display area. The dummy thin film transistor is not connected to the dummy pixel electrode unlike the thin film transistor of the display area. The dummy thin film transistor makes an environment similar to an area close to the display area and reduces the difference between the parasitic capacitance applied to the outermost data line and the parasitic capacitance applied to the inside data line, thereby preventing the display defect.

Hereinafter, a liquid crystal display according to an aspect of the disclosure is described with reference to FIGS. 4 to 6.

Figure 4:
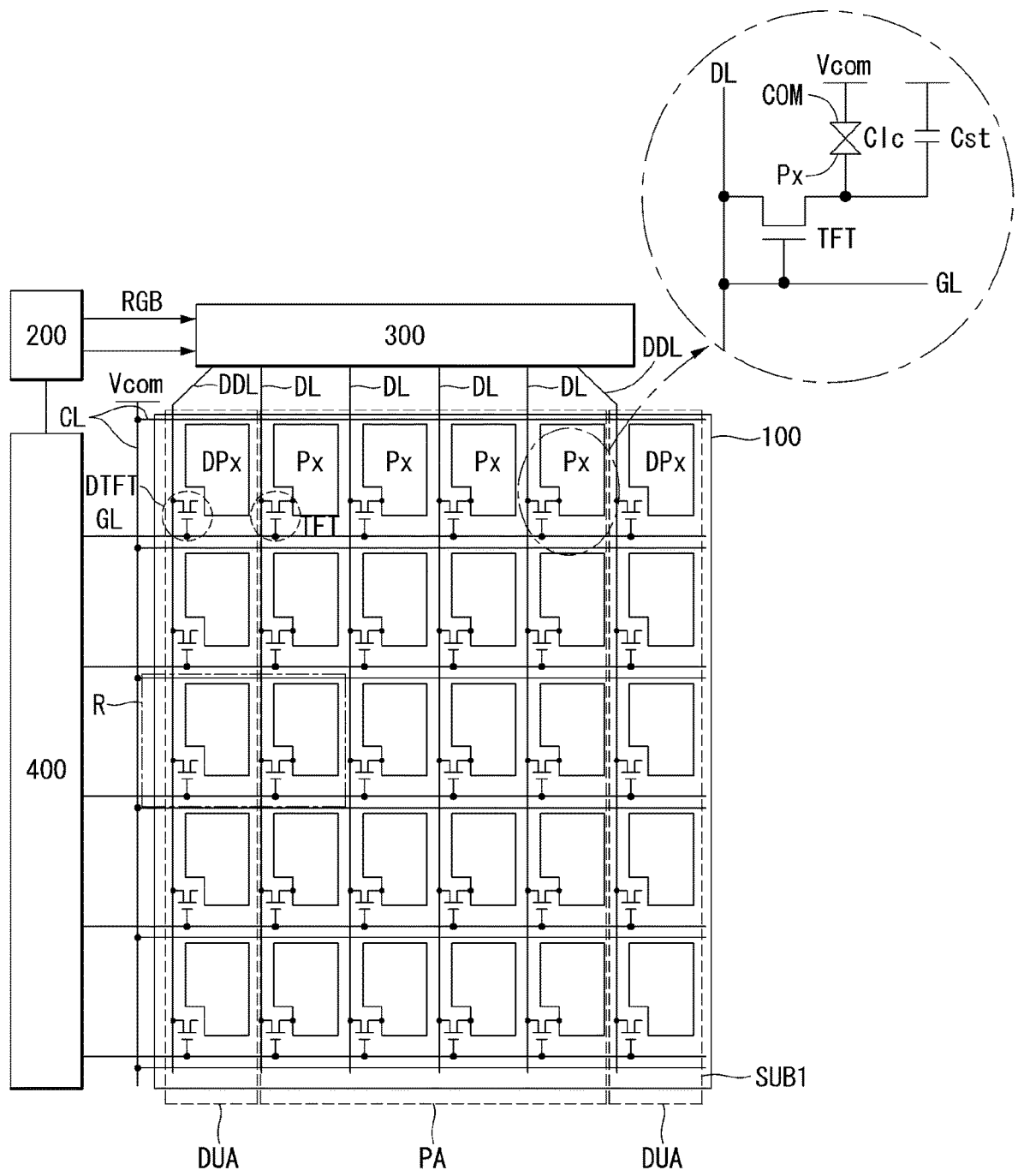
FIG. 4 is a block diagram schematically illustrating a liquid crystal display according to an aspect of the disclosure.

FIG. 4 is a block diagram schematically illustrating a liquid crystal display according to an aspect of the disclosure. FIG. 5 is a plan view illustrating a partial region of FIG. 4. FIG. 6 is a cross-sectional view taken along line I-I' of FIG. 5.

Figure 5:
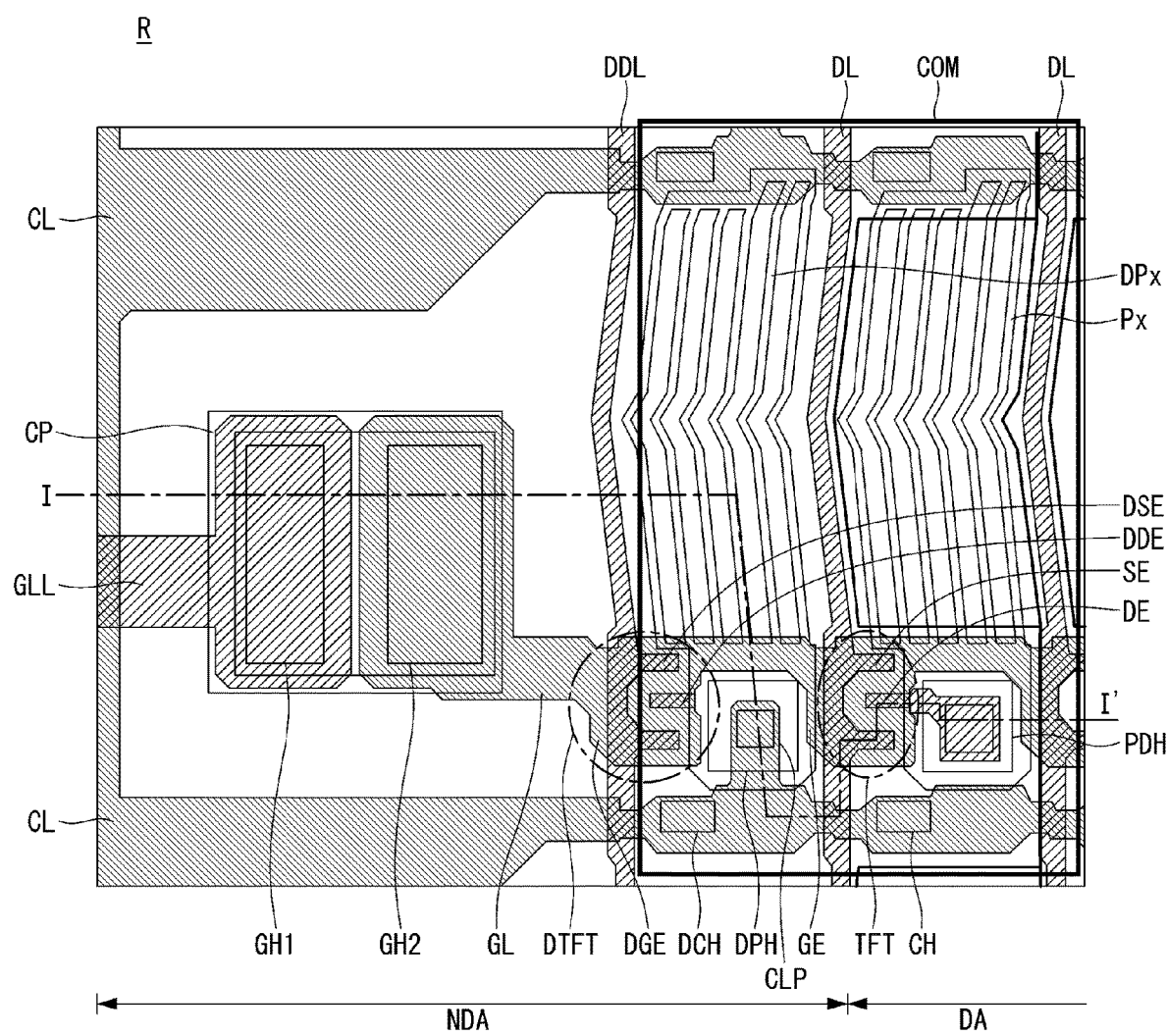
FIG. 5 is a plan view illustrating a partial region of FIG. 4.
Figure 6:
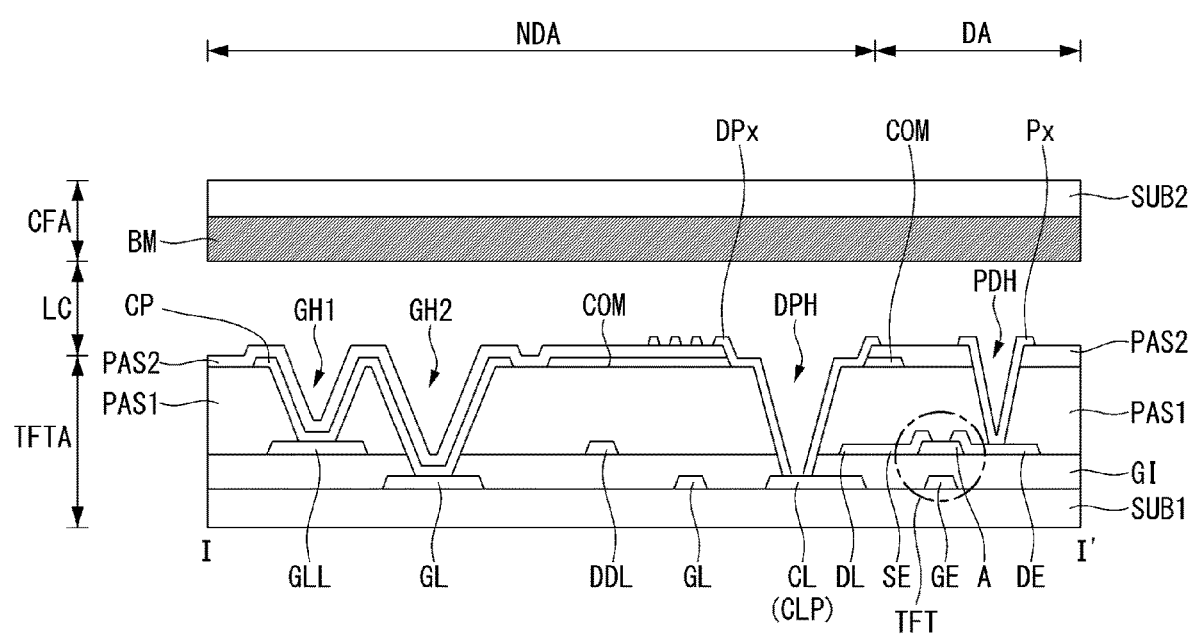
FIG. 6 is a cross-sectional view taken along line I-I' of FIG. 5.

Referring to FIGS. 4 to 6, a liquid crystal display according to an aspect of the disclosure includes a display panel 100, a timing controller 200, a data driving circuit 300, a gate driving circuit 400, and the like.

The display panel 100 includes a thin film transistor array TFTA and a color filter array CFA that are positioned opposite each other with a liquid crystal layer LC interposed therebetween.

The thin film transistor array TFTA includes gate lines GL and data lines DL disposed to cross over each other, a common line CL that crosses over the data lines DL and is disposed in parallel with the gate lines GL, a dummy data line DDL that crosses over the gate lines GL and is disposed in parallel with the data lines DL, dummy pixel electrodes DPx disposed in a dummy area DUA formed by an outermost data line of the data lines DL, the dummy data line DDL, and the gate lines GL, pixel electrodes Px disposed in a pixel area PA between inside data lines of the data lines DL and the gate lines GL, and a common electrode COM disposed to overlap the pixel electrode Px and the dummy pixel electrode DPx.

A dummy thin film transistor DTFT disposed in the dummy area DUA includes a dummy gate electrode DGE extended to be directional from the gate line GL to the common line CL adjacent to the gate line GL in the dummy area DUA, a dummy source electrode DSE that overlaps the dummy gate electrode DGE and is extended from the dummy data line DDL, and a dummy drain electrode DDE that overlaps the dummy gate electrode DGE and is spaced apart from the dummy source electrode DSE by a predetermined distance.

The common line CL includes a protrusion CLP protruding toward the gate line GL adjacent to the common line CL in the dummy area DUA and is connected to the common electrode COM in the dummy area DUA and the pixel area PA. The common line CL is between the dummy gate electrode DGE of the dummy area DUA and a gate electrode GE and is connected to the dummy pixel electrode DPx.

The common electrode COM may be connected to a first substrate SUB1 of the thin film transistor array TFTA or a second substrate SUB2 of the color filter array CFA. For example, aspects of the disclosure are described using an example in which the common electrode COM is formed in the thin film transistor array TFTA as an example.

The common electrode COM is formed to overlap the dummy pixel electrodes DPx and the pixel electrodes Px. The dummy pixel electrodes DPx and the pixel electrodes Px each include a plurality of slits. Because the dummy pixel electrodes DPx are connected to the common electrode COM through the common line CL, the dummy pixel electrodes DPx and the common electrode COM become equipotential. Thus, no electric field is formed between the common electrode COM and the dummy pixel electrodes DPx.

On the other hand, because a data voltage is applied to the pixel electrodes Px through the data lines DL and thin film transistors TFT, and the common voltage Vcom is applied to the common electrode COM through the common line CL, an electric field is formed between the pixel electrodes Px and the common electrode COM. Because each of the pixel electrodes Px includes the plurality of slits, liquid crystal molecules of the liquid crystal layer LC are driven by an electric field formed between the pixel electrodes Px and the common electrode COM.

The color filter array CFA includes color filters CF and black matrix BM disposed on the second substrate SUB2. The black matrix BM is disposed to overlap the gate lines GL of the pixel area PA and the dummy area DUA, the common lines CL, the dummy data lines DDL, the data lines DL, the dummy thin film transistors DTFT, and the thin film transistors TFT, thereby preventing the colors of adjacent areas from being mixed.

The timing controller 200 generates timing control signals for controlling operation timings of the data driving circuit 300 and the gate driving circuit 400 using timing signals from a host controller (not shown). The timing control signals for controlling the operation timings of the data driving circuit 300 and the gate driving circuit 400 include a data timing control signal for controlling the operation timing of the data driving circuit 300 and a polarity of the data voltage and a gate timing control signal for controlling the operation timing of the gate driving circuit 400.

The data driving circuit 300 receives digital video data RGB from the timing controller 200. The data driving circuit 300 converts the digital video data RGB into positive and negative analog data voltages in response to a source timing control signal from the timing controller 200 and then supplies the data voltages to the data lines DL of the display panel 100 so that the data voltages are synchronized with gate pulses (or referred to as "scan pulses").

The gate driving circuit 400 sequentially outputs the gate pulses under the control of the timing controller 200 and shifts a swing voltage of an output of the gate pulses to a gate high voltage VGH and a gate low voltage VGL. The gate pulses output from the gate driving circuit 400 are synchronized with the data voltages output from the data driving circuit 300 and are sequentially supplied to the gate lines GL. The gate high voltage VGH is a voltage equal to or greater than a threshold voltage of the thin film transistor, and the gate low voltage VGL is a voltage less than the threshold voltage of the thin film transistor.

Referring to FIGS. 5 and 6, the liquid crystal display according to an aspect of the disclosure includes the thin film transistor array TFTA and the color filter array CFA that are positioned opposite to each other with the liquid crystal layer LC interposed therebetween.

The common line CL and the gate line GL are disposed on the first substrate SUB1 of the thin film transistor array TFTA in parallel with each other. A gate insulating layer GI is stacked on the first substrate SUB1 to cover the common line CL and the gate line GL.

The dummy data line DDL and the data line DL are disposed on the gate insulating layer GI in parallel with each other. A gate link line GLL extended from the gate driving circuit 400 is disposed on the gate insulating layer GI. In the dummy area DUA, the dummy source electrode DSE and the dummy drain electrode DDE of the dummy thin film transistor DTFT are disposed on the gate insulating layer GI. In the pixel area PA, a source electrode SE and a drain electrode DE of the thin film transistor TFT are disposed on the gate insulating layer GI.

A first passivation layer PAS1 is stacked on the gate insulating layer GI to cover the gate link line GLL, the dummy data line DDL, the data line DL, the dummy thin film transistor DTFT, and the thin film transistor TFT.

In a display area DA, the common electrode COM is disposed on the first passivation layer PAS1. In a non-display area NDA, a gate connection pattern CP is disposed on the first passivation layer PAS1 to overlap the gate link line GLL and the gate line GL.

The gate connection pattern CP is connected to the gate link line GLL exposed through a first gate contact hole GH1 penetrating the first passivation layer PAS1, and the gate line GL exposed through a second gate contact hole GH2 penetrating the first passivation layer PAS1 and the gate insulating layer GI. Hence, the gate link line GLL and the gate line GL are connected to each other by the gate connection pattern CP.

A second passivation layer PAS2 is stacked on the first passivation layer PAS1 to cover the common electrode COM and the gate connection pattern CP.

In the dummy area DUA, the dummy pixel electrodes DPx are disposed on the second passivation layer PAS2 to overlap the common electrode COM. In the pixel area PA, the pixel electrodes Px are disposed on the second passivation layer PAS2 to overlap the common electrode COM.

Because the dummy pixel electrodes DPx belong to the non-display area NDA on which an image is not displayed, the dummy pixel electrodes DPx are not connected to the dummy drain electrode DDE of the dummy thin film transistor DTFT. On the other hand, the dummy pixel electrode DPx is connected to the protrusion CLP of the common line CL exposed through a dummy pixel contact hole DPH penetrating the second passivation layer PAS2, the first passivation layer PAS1, and the gate insulating layer GI.

Because the pixel electrode Px belongs to the display area DA on which an image is displayed, the pixel electrode Px is connected to the drain electrode DE of the thin film transistor TFT. The pixel electrode Px is connected to the drain electrode DE of the thin film transistor TFT exposed through a pixel drain contact hole PDH penetrating the second passivation layer PAS2 and the first passivation layer PAS1.

On the second substrate SUB2 of the color filter array CFA, the color filters CF and the black matrix BM are disposed. The color filters CF are disposed corresponding to the dummy pixel electrode DPx of the dummy area DUA. The black matrix BM overlaps the dummy thin film transistor DTFT of the dummy area DUA and the thin film transistor TFT of the pixel area PA. The black matrix BM partition the color filters CF.

As described above, according to the liquid crystal display according to the aspect of the disclosure, because the dummy pixel electrode disposed in the dummy area is connected to the protrusion of the common line, the parasitic capacitance caused by the common electrode and the pixel electrode can be removed. Hence, the aspect of the disclosure can prevent the display defect.

Furthermore, because the dummy pixel electrode disposed in the dummy area is connected to the common electrode in an area between the gate line and the common line, the dummy pixel contact hole can be disposed on the same line as the drain contact hole without changing the position of the dummy pixel contact hole for connecting the dummy pixel electrode to the protrusion of the common line. Hence, the aspect of the disclosure can prevent the rubbing failure.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A liquid crystal display comprising:
   gate lines and data lines crossing over each other;
   a common line crossing over the data lines and disposed in parallel with the gate lines;
   a dummy data line crossing over the gate lines and disposed in parallel with the data lines;
   a dummy pixel electrode disposed in a dummy area formed by an outermost data line of the data lines, the dummy data line and first and second gate lines adjacent to each other among the gate lines;
a pixel electrode disposed in a pixel area between first and second data lines adjacent to each other among the data lines and the first and second gate lines; and
a common electrode overlapping the pixel electrode and the dummy pixel electrode,
wherein the dummy pixel electrode is electrically connected to the common line.

2. The liquid crystal display of claim 1, wherein the dummy pixel electrode is connected to a protrusion extended from the common line, and the protrusion is disposed between the first gate line and the common line adjacent to each other.

3. The liquid crystal display of claim 1, wherein the common line is connected to the common electrode in the dummy area and the pixel area.

4. The liquid crystal display of claim 1, further comprising:
a dummy thin film transistor disposed in the dummy area, including a dummy gate electrode extended from the first gate line, a dummy source electrode overlapping the dummy gate electrode and extended from the dummy data line, and a dummy drain electrode overlapping the dummy gate electrode and spaced apart from the dummy source electrode by a predetermined distance; and
a thin film transistor disposed in the pixel area, including a gate electrode extended from the first gate line, a source electrode overlapping the gate electrode and extended from the first data line, and a drain electrode overlapping the gate electrode, spaced apart from the source electrode by a predetermined distance, and connected to the pixel electrode.

5. The liquid crystal display of claim 4, wherein the dummy pixel electrode is connected to the common line between the dummy gate electrode and the gate electrode.

6. The liquid crystal display of claim 4, wherein the gate lines and the common line are disposed on a substrate,
wherein the data line, the dummy source electrode, the dummy drain electrode, the source electrode, and the drain electrode are disposed on a gate insulating layer covering the gate lines and the common line.

7. The liquid crystal display of claim 6, further comprising a first passivation layer covering the data line and the common electrode is disposed on the first passivation layer.

8. The liquid crystal display of claim 7, further comprising a second passivation layer covering the common electrode and the dummy pixel electrode and the pixel electrode are disposed on the second passivation layer.

9. The liquid crystal display of claim 8, wherein the dummy pixel electrode is connected to the common line exposed through a dummy pixel contact hole penetrating the second passivation layer, a first passivation layer, and the gate insulating layer.

10. The liquid crystal display of claim 1, further comprising:
a gate link line disposed between the first gate line and a gate driving circuit supplying a gate driving signal to the gate lines; and
a connection pattern connecting the gate link line to the first gate line.

11. The liquid crystal display of claim 1, further comprising a gate link line on the gate insulation and extended from a gate driving circuit supplying a gate driving signal, and connected to the gate line.

12. The liquid crystal display of claim 11, further comprising a connection pattern connecting the gate link line to the gate line.

13. A liquid crystal display comprising:
a gate line and a common line disposed on a substrate and parallel with each other;
a gate insulation layer on the substrate and covering the gate line and the common line;
a data line on the gate insulation layer and crossing over the gate line;
a dummy data line on the gate insulation layer, crossing over the gate line, and disposed in parallel with the data line;
a first passivation layer on the gate insulation layer and covering the data line and a dummy data line;
a common electrode on the first passivation layer;
a second passivation layer on the first passivation layer and covering the common electrode;
a dummy pixel electrode in a dummy area of the second passivation layer; and
a pixel electrode disposed in a pixel area of the second passivation layer, and disposed in parallel with the dummy pixel electrode,
wherein the common electrode overlaps the pixel electrode and the dummy pixel electrode,
wherein the dummy pixel electrode is electrically connected to the common line through a dummy pixel contact hole.

14. The liquid crystal display of claim 13, wherein the pixel electrode is connected to a drain electrode through a drain contact hole in the first and the second passivation layer.

15. The liquid crystal display of claim 13, wherein the dummy pixel contact hole passes through the second passivation layer, the first passivation layer and the gate insulation layer.

16. The liquid crystal display of claim 13, wherein the dummy pixel electrode is connected to a protrusion extended from the common line and the protrusion is disposed between the gate line and the common line adjacent to each other.

17. The liquid crystal display of claim 13, wherein the common line is connected to the common electrode in the dummy area and the pixel area.

18. The liquid crystal display of claim 13, further comprising:
a dummy thin film transistor disposed in the dummy area, including a dummy gate electrode extended from the gate line, a dummy source electrode extended from the dummy data line, and a dummy drain electrode spaced apart from the dummy source electrode by a predetermined distance; and
a thin film transistor disposed in the pixel area, including a gate electrode extended from the gate line, a source electrode extended from the data line, and a drain electrode spaced apart from the source electrode by a predetermined distance, and connected to the pixel electrode.

* * * * *